US009491831B2

(12) United States Patent
Chen et al.

(10) Patent No.: US 9,491,831 B2
(45) Date of Patent: Nov. 8, 2016

(54) WHITE LIGHT EMITTING DEVICE (71) Applicants: LITE-ON OPTO TECHNOLOGY (CHANGZHOU) CO., LTD., Jiangsu Province (CN); LITE-ON TECHNOLOGY CORP., Taipei (TW)

(72) Inventors: Yi-Hsuan Chen, Taipei (TW); Shih-Chang Hsu, Taipei (TW)

(73) Assignees: Lite-On Opto Technology (Changzhou) Co., Ltd., Jiangsu Province (CN); Lite-On Technology Corp., Taipei (TW)

( * ) Notice: Subject to any disclaimer, the term of this patent is extended or adjusted under 35 U.S.C. 154(b) by 0 days.

(21) Appl. No.: 14/697,939

(22) Filed: Apr. 28, 2015

(65) Prior Publication Data

US 2016/0120003 A1     Apr. 28, 2016

(30) Foreign Application Priority Data

Oct. 27, 2014  (CN) .......................... 2014 1 0583957

(51) Int. Cl.
*H05B 33/12* (2006.01)
*H05B 33/06* (2006.01)

(52) U.S. Cl.
CPC .............. *H05B 33/12* (2013.01); *H05B 33/06* (2013.01)

(58) Field of Classification Search
None
See application file for complete search history.

(56) References Cited

U.S. PATENT DOCUMENTS

| 2005/0127833 | A1* | 6/2005 | Tieszen | H01L 33/56 313/512 |
| 2013/0242543 | A1* | 9/2013 | Do | H01L 25/0753 362/97.1 |
| 2013/0277694 | A1* | 10/2013 | Sakuta | C09K 11/7739 257/89 |
| 2014/0301062 | A1* | 10/2014 | David | F21K 9/56 362/84 |
| 2014/0362885 | A1* | 12/2014 | Sakuta | H01L 33/44 372/44.01 |

* cited by examiner

*Primary Examiner* — Ashok Patel
(74) *Attorney, Agent, or Firm* — Rosenberg, Klein & Lee (57) ABSTRACT

A white light emitting device includes an LED chip capable of emitting light with a peak wavelength of 390 to 430 nm, and a wavelength conversion layer including first, second and third fluorescent materials. The first fluorescent material is capable of being excited to emit light with a peak wavelength of 450 to 470 nm. The second fluorescent material is capable of being excited to emit light with a peak wavelength of 450 to 470 nm. The third fluorescent material is capable of being excited to emit light with a peak wavelength of 630 to 650 nm. Light emitted by the white light emitting device has a color temperature below 5000 K, and a general color rendering index value (Ra) and special color rendering index values (R9-R15) all greater than 90.

16 Claims, 5 Drawing Sheets

WHITE LIGHT EMITTING DEVICE

CROSS-REFERENCE TO RELATED APPLICATION

This application claims priority of Chinese Patent Application No. 201410583957.3, filed on Oct. 27, 2014.

FIELD OF THE INVENTION

This invention relates to a white light emitting device, more particularly to a white light emitting device capable of emitting light that has high color rendering index value.

BACKGROUND OF THE INVENTION

A light source emitting light with a rather high color rendering index value could realistically reveal colors of an illuminated object. On the other hand, another light source emitting light with a rather low color rendering index value would distort colors of an object exposed thereunder.

A light emitted by an existing light source including a light emitting diode (LED) chip and having a color temperature of less than 5000K usually could not reach a desirable color rendering index value, that is, a general color rendering index value Ra and special color rendering index values R9-R15 thereof could not all be greater than 90. In particular, one of the special color rendering index values R9 and R12 for the light emitted by the existing light source usually could not reach a value of greater than 90.

An LED light source is known to be energy-efficient, environment-friendly and long-lasting. In order to better promote implementation of the LED light source, it is required in the art to provide an LED light source that could emit light having high color rendering index value.

SUMMARY OF THE INVENTION

An object of the present invention is to provide a white light emitting device which emits light having a color temperature less than 5000 K, a general color rendering index value (Ra) greater than 90, and special color rendering index values (R9-R15) greater than 90.

According to the present invention, there is provided a white light emitting device, which includes an LED chip and a wavelength conversion layer formed on the LED chip. The wavelength conversion layer includes at least three wavelength-difference fluorescent materials, wherein one is capable of being excited to emit light with a peak wavelength of 450 nm to 470 nm, another is capable of being excited to emit light with a peak wavelength of 520 nm to 530 nm and still another is capable of being excited to emit light with a peak wavelength of 630 nm to 650 nm. Combined to a specific selection and mixture ratio of these three fluorescent materials, light emitted by the white light emitting device has a color temperature that is less than 5000 K, a general color rendering index value (Ra) that is greater than 90, and special color rendering index values (R9-R15) that are all greater than 90.

BRIEF DESCRIPTION OF THE DRAWINGS

Other features and advantages of the present invention will become apparent in the following detailed description of the embodiments with reference to the accompanying drawings, of which.

DETAILED DESCRIPTION OF THE EXEMPLARY EMBODIMENTS

Before the present invention is described in greater detail with reference to the accompanying exemplary embodiments, it should be noted herein that like elements are denoted by the same reference numerals throughout the disclosure.

Figure 1:
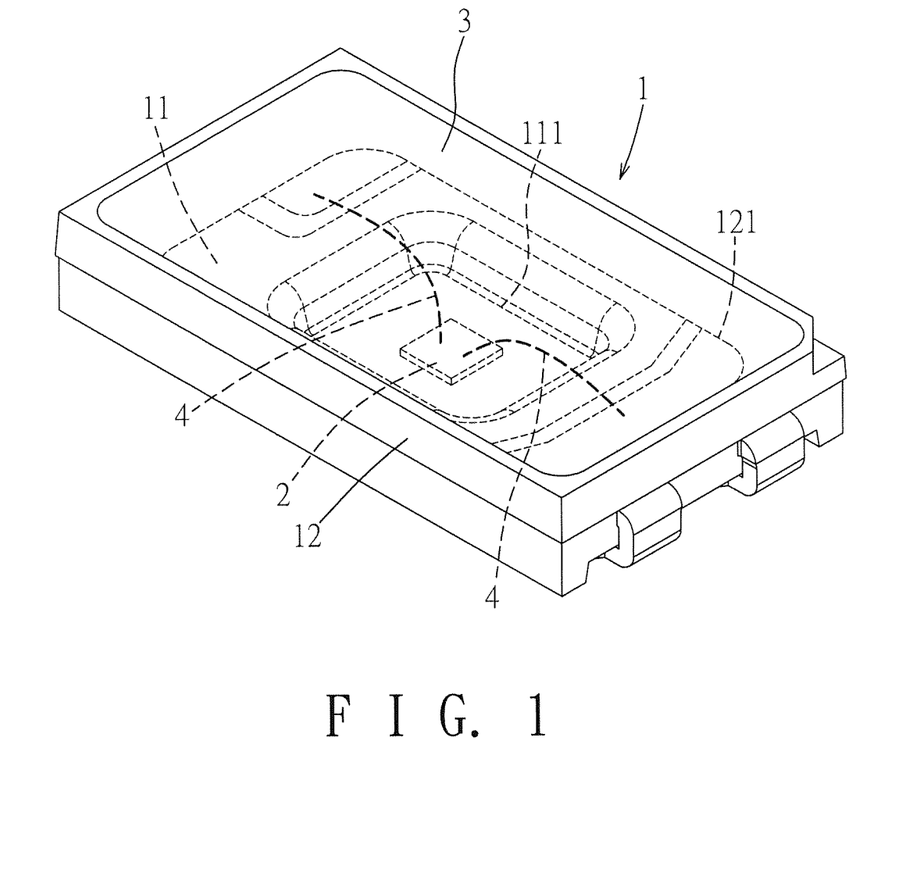
FIG. 1 is a perspective view of a first embodiment of a white light emitting device according to the present invention.
Figure 2:
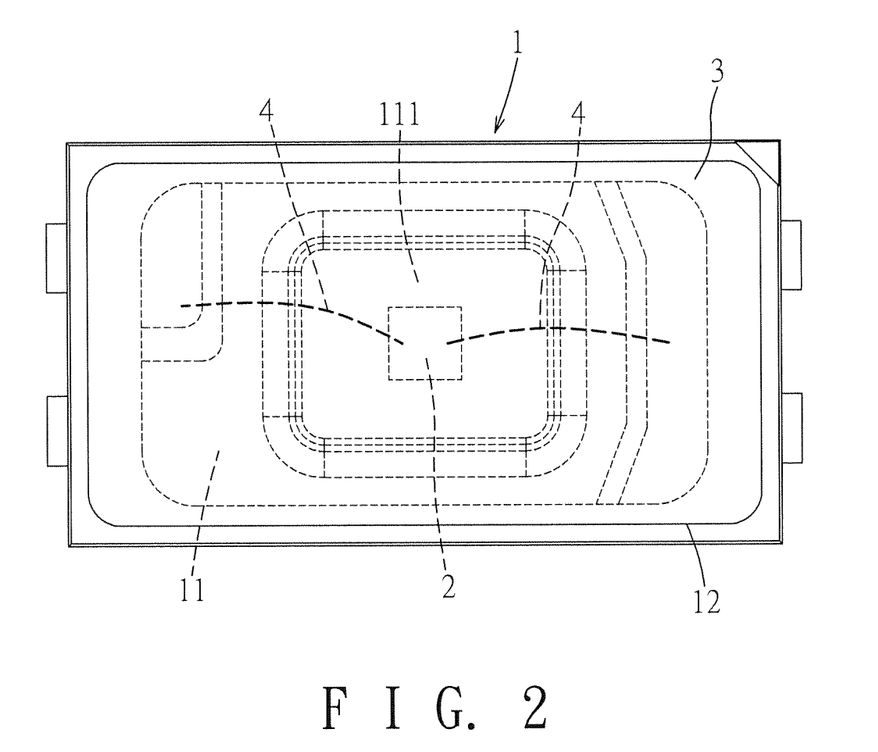
FIG. 2 is a top view of the first embodiment.

Referring to FIGS. 1 and 2, a first embodiment of a white light emitting device according to the present invention includes a base 1, a LED chip 2 and a wavelength conversion layer 3 formed on the LED chip 2.

The base 1 includes a lead frame 11 and a frame 12 connected to the lead frame 11. The frame 12 cooperates with the lead frame 11 to define a receiving space 121 for receiving the LED chip 2, which is disposed on and electrically connected to the lead frame 11 through metal wires 4. In the first embodiment, the LED chip 2 is a near-UV LED chip that is capable of emitting first light with a peak wavelength of 390 nm to 430 nm, more particularly, a first light with a peak wavelength ($W_p$) of 407 nm. The wavelength conversion layer 3 is disposed in the receiving space 121, encapsulates the LED chip 2, and includes a medium such as resin, and at least three fluorescent materials mixed therein, wherein a first fluorescent material is capable of being excited by first excitation light (e.g., the first light emitted by the LED chip 2) to emit second light with a peak wavelength of 450 nm to 470 nm, a second fluorescent material is capable of being excited by second excitation light, such as parts of the first light and second light, to emit third light with a peak wavelength of 520 nm to 530 nm, and the third fluorescent material is capable of being excited by third excitation light, such as parts of the first, second and third light, to emit forth light with a peak wavelength of 630 nm to 650 nm. Specifically, the first, second, and third fluorescent materials are capable of being excited individually to emit blue, green, and red light. The lead frame 11 includes an installation recess 111 that is part of the receiving space 121 and that is for installation of the LED chip 2 therein.

Alternatively, the wavelength conversion layer 3 is filled in the receiving space 121 outside the installation recess 111.

Figure 3:
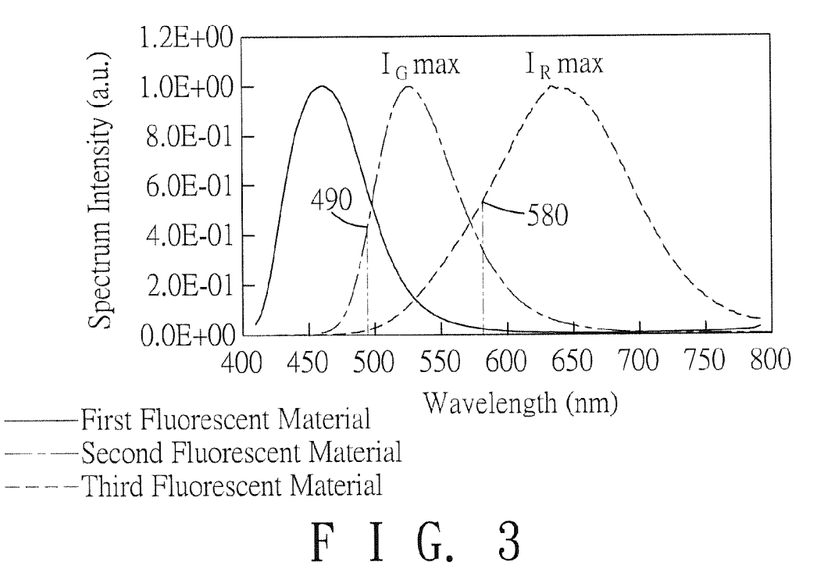
FIG. 3 is a spectrogram showing emission spectra of a first fluorescent material, a second fluorescent material and a third fluorescent material of the first embodiment.

FIG. 3 is a spectrogram showing emission spectra of the fluorescent materials used in the embodiment. In order to effectively increase special color rendering index value R12, which substantially represents a strong blue color, the first fluorescent material (i.e., blue fluorescent powder) is used. The blue fluorescent powder has a spectrum with full width at half maximum (FWHM) wider than that of the spectrum of a common blue LED chip. light emitted by the first fluorescent material has a wavelength that primarily ranges from 432 nm to 492 nm, and that may extend down to 410 nm and up to 550 nm (even up to 600 nm). Light with a wavelength below 430 nm could be used as excitation light for the first fluorescent material, and thus the near-UV LED chip described above is used as the LED chip 2. It is noted that the second fluorescent material has a ratio of spectrum intensity at 490 nm ($I_G(490$ nm$)$) to a spectrum intensity at peak wavelength ($I_G(W_p)$) not smaller than 0.3 (i.e., $I_G(490$ nm$)/I_G(W_p) \geq 0.3$). Thus, the entirety light intensity around 490 nm can be enhanced efficiently by combining the light produced by the first fluorescent material and the light produced by the second fluorescent material. With the addition of the second fluorescent material, the special color rendering index value R12 could reach a value larger than 90. Light emitted by the second fluorescent material has a wavelength that primarily ranges from 503 nm to 563 nm, and that may extend down to 460 nm and up to 640 nm (even up to 700 nm). Light emitted by the third fluorescent material has a wavelength that primarily ranges from 600 nm to 700 nm, and that may extend down to 500 nm and up to 750 nm (even up to 800 nm). The third fluorescent material has a spectrum with a full width at half maximum (FWHM) greater than 100 nm, and has a ratio of a spectrum intensity at 580 nm ($I_R(580$ nm$)$) to a spectrum intensity at peak wavelength ($I_R(W_p)$) not smaller than 0.3 (i.e., $I_R(580$ nm$)/I_R(W_p) \geq 0.3$) for increasing an overlapping area between the emission spectrum of the second fluorescent material and that of the third fluorescent material, whereby a difference between the peaks of these two emission spectra is reduced so as to form a relatively continuous and smooth overall spectrum. The general color rendering index value Ra and special color rendering index values R9-R15 are all greater than 90. Therefore, color rendering index value of light emitted by the white light emitting device is improved.

Figure 4:
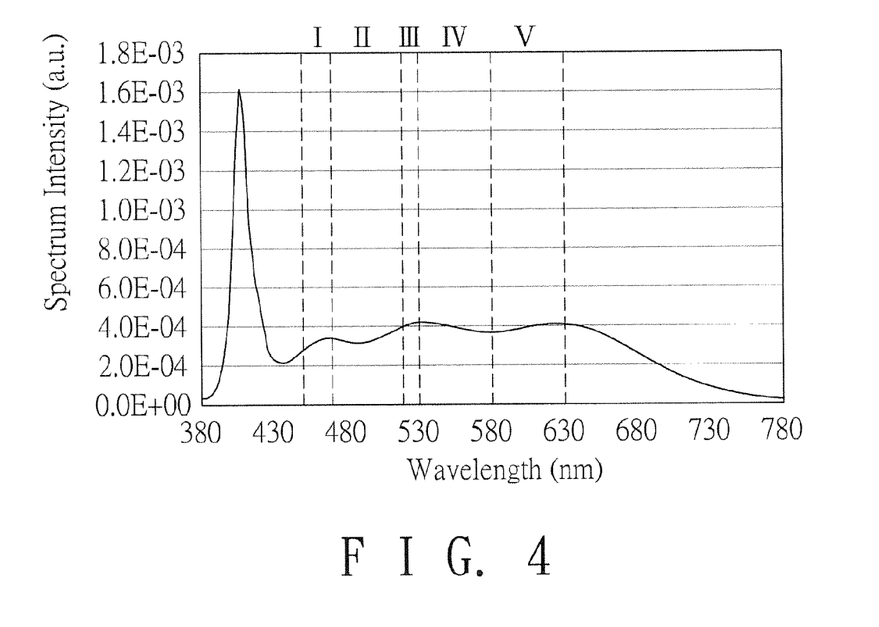
FIG. 4 is a spectrogram showing an emission spectrum of an overall light of the first embodiment.

FIG. 4 illustrates an overall spectrum of the light emitted by the LED chip 2 and the excited first, second and third fluorescent materials. In the first embodiment, multiple samples were tested. Spectrum intensity ratios of the samples are shown in Table 1. $I_C(W_p)$ represents a spectrum intensity at peak wavelength of the LED chip 2. $I_B(W_p)$ represents a spectrum intensity at peak wavelength of the first fluorescent material. $I_G(W_p)$ represents a spectrum intensity at peak wavelength of the second fluorescent material. $I_R(W_p)$ represents a spectrum intensity at peak wavelength of the third fluorescent material. Based on $I_B(W_p)$, a ratio of $I_C(W_p):I_B(W_p):I_G(W_p):I_R(W_p)$ is in the range of 3.4-5.2:1:1-1.6:1-1.5. $I_C(W_p)$, $I_G(W_p)$ and $I_R(W_p)$ normalized to $I_B(W_p)$ for different samples A, B, C, D and E are shown in Table 1.

TABLE 1

| | Spectrum Intensity Ratio | | | |
|---|---|---|---|---|
| | $I_C(W_p)$ | $I_B(W_p)$ | $I_G(W_p)$ | $I_R(W_p)$ |
| peak wavelength (nm) | 402-412 | 456-476 | 523-543 | 609-639 |
| Sample A | 3.43 | 1 | 1.06 | 1.08 |
| Sample B | 3.81 | 1 | 1.17 | 1.20 |
| Sample C | 4.27 | 1 | 1.28 | 1.27 |

TABLE 1-continued

| | Spectrum Intensity Ratio | | | |
|---|---|---|---|---|
| | $I_C(W_p)$ | $I_B(W_p)$ | $I_G(W_p)$ | $I_R(W_p)$ |
| Sample D | 4.68 | 1 | 1.38 | 1.33 |
| Sample E | 5.15 | 1 | 1.52 | 1.46 |

For an overall light having a color temperature of 4875 K, a general color rendering index value (Ra) and special color rendering index values (R9-R15) are all larger than 90. Detailed values are shown in Table 2.

TABLE 2

| Color Temperature (K) | 4875 | R5 | 98 | R11 | 96 |
|---|---|---|---|---|---|
| Ra | 97.4 | R6 | 98 | R12 | 96 |
| R1 | 98 | R7 | 98 | R13 | 98 |
| R2 | 99 | R8 | 97 | R14 | 97 |
| R3 | 95 | R9 | 96 | R15 | 97 |
| R4 | 96 | R10 | 97 | | |

Figure 5:
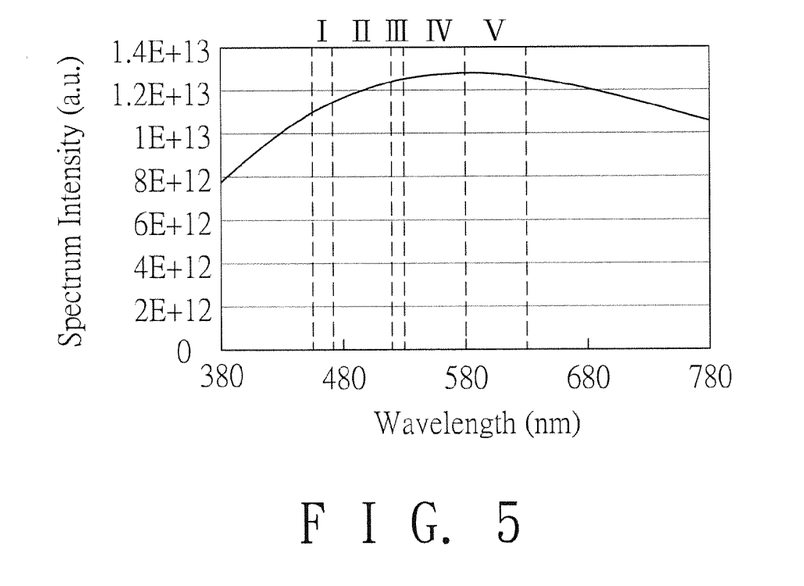
FIG. 5 is a spectrogram showing an emission spectrum of a reference light source having a color temperature of 5000K.

FIG. 5 illustrates a spectrogram of reference light having a color temperature close to 5000 K. Referring to both FIGS. 4 and 5, each of the spectra is divided into section I, section II, section III, section IV and section V that respectively have wavelength ranges of 450-470 nm, 470-520 nm, 520-530 nm, 530-580 nm and 580-630 nm. In each of the sections, the overall spectrum of the light emitted by the white light emitting device according to the present invention has a waveform similar to those of a corresponding section of the spectrum of light emitted by the reference light source. For example, waveforms in sections III, IV and V produced by the reference light source are continuous and nearly smooth. The waveforms in sections III, IV and V produced by the white light emitting device should be continuous and nearly smooth preferably.

Furthermore, the fluorescent materials used in the present invention may be chosen according to waveform distribution of the light emitted by the reference light source. A waveform of an overall spectrum of the light emitted by the fluorescent materials and the LED chip 2 must be similar to those of the reference light source. It is difficult to obtain an overall spectrum exactly the same as that of the reference light source. Therefore, in order to reach desirable color rendering index values (Ra, R9-R15), at least two of the sections I, II, III, IV, V of the spectrum of the light emitted by the white light emitting device must have waveform distribution trends respectively similar to those of corresponding sections of the spectrum of the light emitted by the reference light source. To be more specific, the sections I and II may be defined as a first group and the sections III, IV and V may be defined as a second group. At least one of the sections of each of the first and second groups of the spectrum of the light emitted by the white light emitting device must have waveform distribution trend similar to that of a corresponding section of the spectrum of the light emitted by the reference light source. For example, both of the sections I and IV of the spectrum of the light emitted by the white light emitting device have waveform distribution trends respectively the same as those of corresponding sections of the spectrum of the light emitted by the reference light source. In another example, all of the sections II, III and V, of the spectrum of the light emitted by the white light emitting device have waveform distribution trends respectively the same as those of corresponding sections of the spectrum of the light emitted by the reference light source.

The waveform distribution trends of the spectrum of the first group and the sections I and II of the light emitted by the white light emitting device and the light emitted by the reference light source are all trending up. The waveform distribution trends of the spectrum of the second group and the sections III, IV and V of the light emitted by the white light emitting device and the light emitted by the reference light source are all substantially flat.

In the first embodiment, the first fluorescent material is a blue fluorescent powder that includes an aluminate phosphor, such as a $Eu^{2+}$ doped barium magnesium aluminate (BAM:Eu) powder, specifically a fluorescent powder having a chemical formula of $BaMgAl_{10}O_{17}$:Eu. The second fluorescent material is a green fluorescent powder that includes a silicate phosphor, specifically a fluorescent powder having a chemical formula of $(Ba,Sr,Ca)_2SiO_4$:Eu. The third fluorescent material is a red fluorescent powder that includes an europium-activated nitride phosphor or an oxynitride phosphor, such as a CASN, SCASN or CASON fluorescent powder, specifically a fluorescent powder having a chemical formula of $CaAlSi(ON)_3$:Eu.

The white light emitting device illustrated in FIG. 1 includes the first, second and third fluorescent materials used in amounts that have a ratio of 8:1:2. A total of the first, second and third fluorescent materials is 20.5 wt % based on a weight of the medium.

Figure 6:
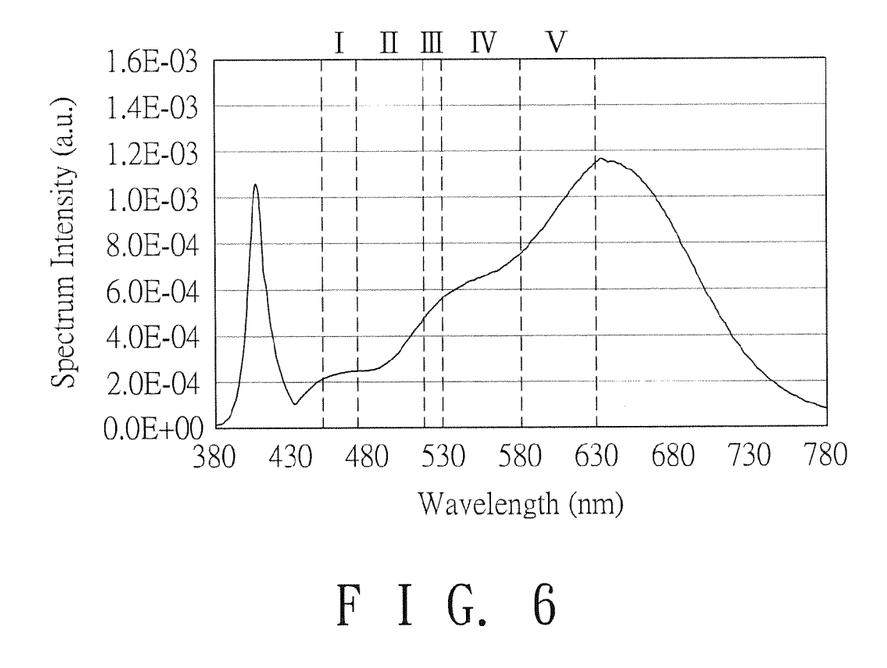
FIG. 6 is a spectrogram showing an emission spectrum of an overall light of a second embodiment of a white light emitting device according to the present invention.
Figure 7:
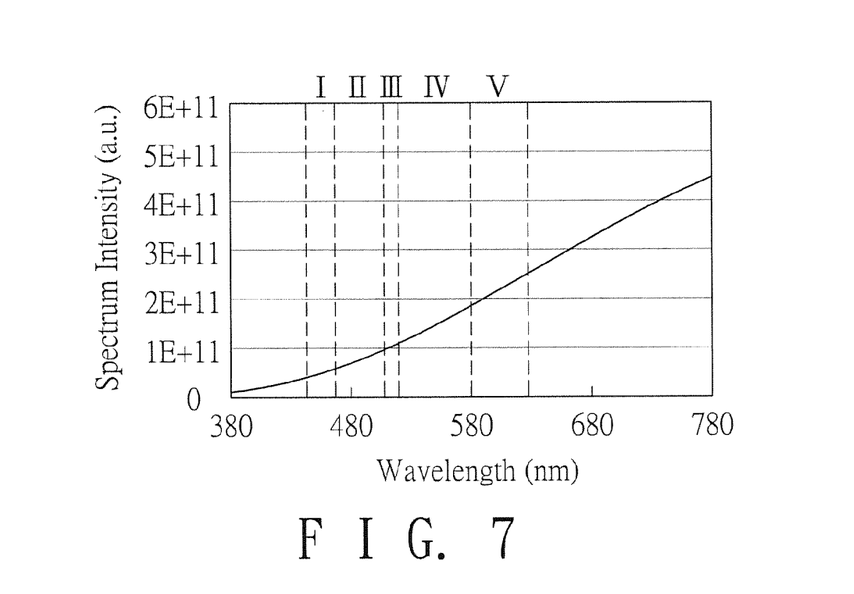
FIG. 7 is a spectrogram showing an emission spectrum of a reference light source having a color temperature of 2700K.

FIG. 6 is a spectrogram showing a spectrum of overall light emitted by a second embodiment of the white light emitting device according to the present invention, which has a structure similar to that of the first embodiment (shown in FIG. 1) and which differs from the first embodiment in that an overall light emitted by the first, second and third fluorescent materials has a color temperature of 2733 K. FIG. 7 is a spectrogram showing a spectrum of light emitted by reference light source that has a color temperature of 2700 K. In FIGS. 6 and 7, each of the spectra is divided into section I, section II, section III, section IV and section V that respectively have wavelength ranges of 450-470 nm, 470-520 nm, 520-530 nm, 530-580 nm and 580-630 nm. In each of the sections, the overall spectrum of the light emitted by the white light emitting device according to the second embodiment of the present invention has waveform distribution trends the same as those of a corresponding section of the spectrum of light emitted by the reference light source. The waveform distribution trends of the overall spectrum and spectra of each of the sections I, II, III, IV, V of the light emitted by the white light emitting device and the light emitted by the reference light source are all trending up. Likewise, the light emitted by the white light emitting device of the second embodiment has a general color rendering index value (Ra) and special color rendering index values (R9-R15) that are all larger than 90. Detailed values are shown in Table 3.

TABLE 3

| Color Temperature (K) | 2733 | R5 | 98 | R11 | 95 |
| --- | --- | --- | --- | --- | --- |
| Ra | 97.2 | R6 | 99 | R12 | 92 |
| R1 | 99 | R7 | 97 | R13 | 99 |
| R2 | 98 | R8 | 97 | R14 | 96 |
| R3 | 94 | R9 | 91 | R15 | 98 |
| R4 | 95 | R10 | 95 | | |

Figure 8:
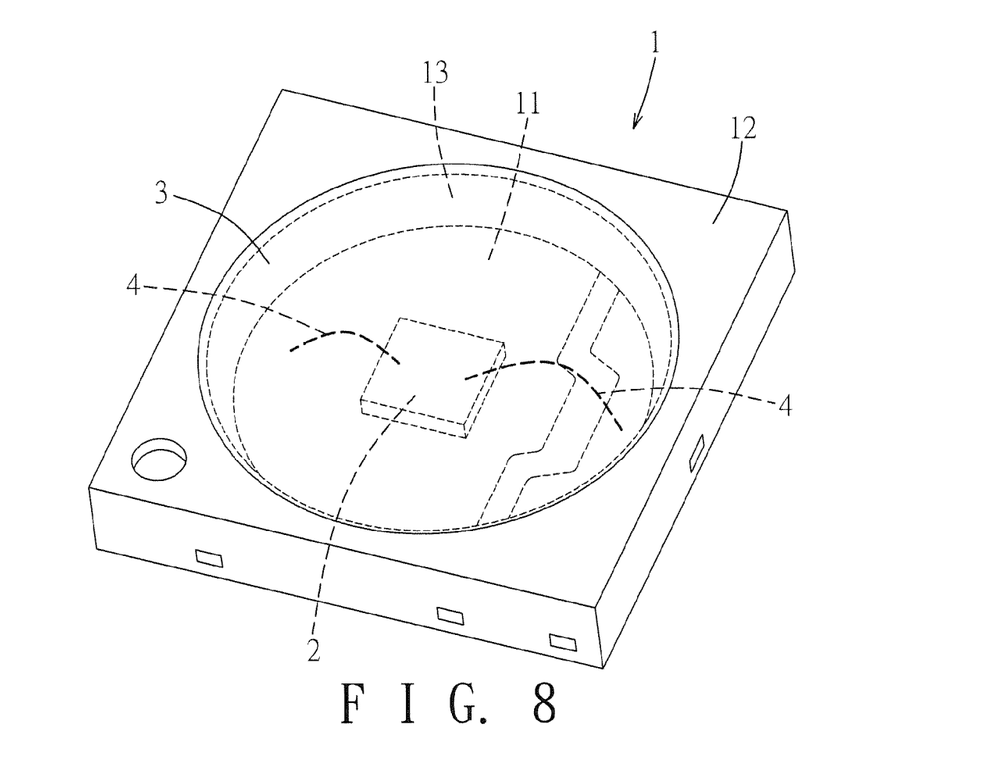
FIG. 8 is a perspective view of a third embodiment of a white light emitting device according to the present invention.

FIG. 8 illustrates a third embodiment of the white light emitting device according to the present invention. The white light emitting device of the third embodiment includes a base 1 that includes a lead frame 11, and a frame 12 surrounding the lead frame 11. The frame 12 cooperates with the lead frame 11 to define a receiving space 13 for receiving the LED chip 2 that is disposed on the lead frame 11. A wavelength conversion layer 3 is filled in the receiving space 13 and encapsulates the LED chip 2. In the third embodiment, the base 1 is substantially square-shaped and the receiving space 13 is substantially circular-shaped. In the third embodiment, a total of the first, second and third fluorescent materials ranges from 50 wt % to 70 wt % based on a weight of the medium, and light emitted by the third embodiment could reach a color rendering index value similar to that of the first embodiment. According to different packaging configurations of the white light emitting device according to the present invention, a total weight percentage of the first, second and third fluorescent materials of the wavelength conversion layer 3 may be substantially represented by a formula of $y=-20.11 \ln(x)+43.067$, in which x represents a total volume of the wavelength conversion layer 3, and y represents a total weight percentage of the first, second and third fluorescent materials.

Table 4 shows Examples (a), (b) and (c) that are associated with the formula. With the total volume of the wavelength conversion layer, a corresponding total weight percentage of the first, second and third fluorescent materials can be calculated by the formula.

TABLE 4

| Example | Total volume of the wavelength conversion layer ($mm^3$) | Actual usage of the fluorescent materials (wt %) | Total weight percentage of the first, second and third fluorescent materials (wt %) |
| --- | --- | --- | --- |
| (a) | 5.782 | 10.2 | 7.778985 |
| (b) | 2.13 | 21.8 | 27.86139 |
| (c) | 1.1 | 44.8 | 41.15031 |

Besides the embodiments disclosed hereinabove, the wavelength conversion layer may include a fluorescent element including the first, second and third fluorescent materials, and an encapsulant element including the medium. The fluorescent element may be disposed on the LED chip or on an exterior surface of the encapsulant element. In a remote phosphor light emitting configuration, the wavelength conversion layer may only include the fluorescent materials and be disposed on an exterior and interior surfaces of a remote optical structure.

To sum up, through the combination of the near-UV LED chip with three fluorescent materials emitting light with specific wavelengths and spectra, the overall light emitted by the white light emitting device could have a color temperature less than 5000 K, while a general color rendering index value Ra and special color rendering index values R9-R15 of the light emitted thereby are all greater than 90.

While the present invention has been described in connection with what are considered the most practical embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A white light emitting device comprising:
    an LED chip emitting light with a peak wavelength of 390 nm to 430 nm; and
    a wavelength conversion layer including:
        a first fluorescent material emitting light with a peak wavelength of 450 nm to 470 nm when excited;
        a second fluorescent material emitting light with a peak wavelength of 520 nm to 530 nm when excited and that has a ratio of a spectrum intensity at 490 nm ($I_G$(490 nm)) to a spectrum intensity at peak wavelength ($I_G(W_P)$) not smaller than 0.3; and
        a third fluorescent material emitting light with a peak wavelength of 630 nm to 650 nm when excited and that has a ratio of a spectrum intensity at 580 nm ($I_R$(580 nm)) to a spectrum intensity at peak wavelength ($I_R(W_P)$) not smaller than 0.3;
    wherein light emitted by said white light emitting device has a color temperature that is less than 5000K, a general color rendering index value (Ra) that is greater than 90, and special color rendering index values (R9-R15) that are all greater than 90.

2. The white light emitting device as claimed in claim 1, wherein said LED chip has a spectrum intensity at peak wavelength ($I_C(W_p)$), said first fluorescent material having a spectrum intensity at peak wavelength ($I_B(W_p)$), a ratio of $I_C(W_p):I_B(W_p):I_G(W_p):I_R(W_p)$ being in the range of 3.4-5.2:1:1-1.6:1-1.5.

3. The white light emitting device as claimed in claim 1, wherein the light emitted by said third fluorescent material has a full width at half maximum (FWHM) larger than 100 nm.

4. The white light emitting device as claimed in claim 1, wherein said first fluorescent material includes a barium aluminate phosphor, said second fluorescent material includes a silicate phosphor, and said third fluorescent material includes an europium-activated nitride phosphor or an oxynitride phosphor.

5. The white light emitting device as claimed in claim 1, further comprising a base which includes a lead frame and a frame connected to said lead frame, said frame cooperating with said lead frame to define a receiving space, said LED chip being electrically connected to said lead frame and being disposed in said receiving space, said wavelength conversion layer further including a medium that is disposed in said receiving space and that encapsulates said LED chip.

6. The white light emitting device as claimed in claim 5, wherein a relation of a total volume of said wavelength conversion layer to a total weight percentage of said first, second and third fluorescent materials of said wavelength conversion layer is represented by a formula of $y=-20.11 \ln(x)+43.067$,
    wherein x represents a total volume of said wavelength conversion layer, and y represents a total weight percentage of said first, second and third fluorescent materials.

7. A white light emitting device comprising:
    an LED chip emitting light with a peak wavelength of 390 nm to 430 nm; and
    a wavelength conversion layer including:
        a first fluorescent material emitting light with a peak wavelength of 450 nm to 470 nm when excited;
        a second fluorescent material emitting light with a peak wavelength of 520 nm to 530 nm when excited; and
        a third fluorescent material emitting light with a peak wavelength of 630 nm to 650 nm when excited;
    wherein a spectrum of light emitted by said white light emitting device is divided into section I, section II, section III, section IV and section V that respectively have wavelength ranges of 450-470 nm, 470-520 nm, 520-530 nm, 530-580 nm and 580-630 nm, at least two of said sections I, II, III, IV, V of the spectrum of the light emitted by said white light emitting device having waveform distribution trends respectively similar to those of corresponding sections of a spectrum of light emitted by a reference light source having a color temperature corresponding to that of said white light emitting device, so that the light emitted by said white light emitting device has a color temperature less than 5000 K, a general color rending index value (Ra) greater than 90, and special color rendering index values (R9-R15) all greater than 90.

8. The white light emitting device as claimed in claim 7, wherein said sections I and II are defined as a first group, said sections III, IV and V being defined as a second group, at least one of said sections of each of said first and second groups of the spectrum of the light emitted by said white light emitting device having a waveform distribution trend similar to that of a corresponding section of the spectrum of the light emitted by the reference light source.

9. The white light emitting device as claimed in claim 8, wherein the light emitted by said white light emitting device has a color temperature close to 5000 K, waveform distribution trends of spectrum of said first group and said sections I and II of the light emitted by said white light emitting device and the light emitted by the reference light source being all trending up, waveform distribution trends of spectrum of said second group and said sections III, IV and V of the light emitted by said white light emitting device and the light emitted by the reference light source being all substantially flat.

10. The white light emitting device as claimed in claim 8, wherein the light emitted by said white light emitting device has a color temperature close to 2700 K, waveform distribution trends of an over spectrum and spectra of each of said sections I, II, III, IV, V of the light emitted by said white light emitting device and the light emitted by the reference light source being all trending up.

11. The white light emitting device as claimed in claim 7, further comprising a base which includes a lead frame and a frame connected to said lead frame, said frame cooperating with said lead frame to define a receiving space, said LED chip being electrically connected to said lead frame and being disposed in said receiving space, said wavelength conversion layer further including a medium that is disposed in said receiving space and that encapsulates said LED chip.

12. A white light emitting device comprising:
    an LED chip emitting light with a peak wavelength of 390 nm to 430 nm; and
    a wavelength conversion layer including:
        a blue fluorescent material that has a chemical formula of $BaMgAl_{10}O_{17}:Eu$; and
        a red fluorescent material that has a chemical formula of $CaAlSi(ON)_3:Eu$;
    wherein light emitted by said white light emitting device has a color temperature less than 5000K, a general color rending index value (Ra) greater than 90, and special color rendering index values (R9-R15) all greater than 90; and wherein said wavelength conversion layer further includes a green fluorescent material that has a chemical formula of $(Ba, Sr, Ca)_2SiO_4:Eu$.

13. The white light emitting device as claimed in claim 12, further comprising a base which includes a lead frame and a frame connected to said lead frame, said frame cooperating with said lead frame to define a receiving space, said LED chip being connected to said lead frame and being disposed in said receiving space, said wavelength conversion layer further including an encapsulant that is disposed in said receiving space and that encapsulates said LED chip.

14. The white light emitting device as claimed in claim 12, wherein said blue, green and red fluorescent materials are used in amounts having a weight ratio of 8:1:2.

15. The white light emitting device as claimed in claim 12, further comprising a base that includes a lead frame and a frame connected to said lead frame, said frame cooperating with said lead frame to define a receiving space, said LED chip being connected to said lead frame and being disposed in said receiving space, said wavelength conversion layer further including an encapsulant that is disposed in said receiving space and that encapsulates said LED chip.

16. The white light emitting device as claimed in claim 15, wherein a relation of a total volume of said wavelength conversion layer to a total weight percentage of said blue, green and red phosphors of said wavelength conversion layer is represented by a formula of $y=-20.11 \ln(x)+43.067$,
wherein x represents a total volume of said wavelength conversion layer, and y represents a total weight percentage of said blue, green and red phosphors.

* * * * *